United States Patent
Pfirsch et al.

(10) Patent No.: US 11,575,032 B2
(45) Date of Patent: Feb. 7, 2023

(54) VERTICAL POWER SEMICONDUCTOR DEVICE AND MANUFACTURING METHOD

(71) Applicant: Infineon Technologies AG, Neubiberg (DE)

(72) Inventors: Frank Dieter Pfirsch, Munich (DE); Christian Philipp Sandow, Haar (DE); Dorothea Werber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 87 days.

(21) Appl. No.: 17/315,627

(22) Filed: May 10, 2021

(65) Prior Publication Data

US 2021/0359117 A1   Nov. 18, 2021

(30) Foreign Application Priority Data

May 14, 2020 (DE) .......................... 102020113145.3

(51) Int. Cl.
  *H01L 29/739* (2006.01)
  *H01L 29/78* (2006.01)
  *H01L 29/10* (2006.01)
  *H01L 29/66* (2006.01)

(52) U.S. Cl.
  CPC ...... *H01L 29/7397* (2013.01); *H01L 29/1095* (2013.01); *H01L 29/66348* (2013.01); *H01L 29/66734* (2013.01); *H01L 29/7813* (2013.01)

(58) Field of Classification Search
  CPC ............. H01L 29/7397; H01L 29/1095; H01L 29/66348; H01L 29/66734; H01L 29/7813
  USPC ......................................................... 257/139
  See application file for complete search history.

(56) References Cited

U.S. PATENT DOCUMENTS

| 9,024,382 | B2* | 5/2015 | Kitagawa | H01L 29/7825 257/342 |
| 2008/0012040 | A1* | 1/2008 | Saito | H01L 29/1095 257/E29.066 |
| 2017/0005186 | A1 | 1/2017 | Hirabayashi et al. | |
| 2020/0152777 | A1* | 5/2020 | Iwasaki | H01L 29/4983 |

FOREIGN PATENT DOCUMENTS

JP  2011165928 A  * 8/2011  ......... H01L 29/0696

* cited by examiner

*Primary Examiner* — Igwe U Anya

(74) *Attorney, Agent, or Firm* — Murphy, Bilak & Homiller, PLLC

(57) ABSTRACT

A vertical power semiconductor device includes a semiconductor body having opposing first and second main surfaces. At least part of a gate trench structure formed at the first main surface extends along a first lateral direction. Body and source regions directly adjoin the gate trench structure. A drift region is arranged between the body region and second main surface. A body contact structure includes first and second body contact sub-regions spaced at a first lateral distance along the first lateral direction. Each body contact sub-region directly adjoins the gate trench structure and has a larger doping concentration than the body region. In a channel region between the body contact sub-regions, the body contact structure has a second lateral distance to the gate trench structure along a second lateral direction perpendicular to the first lateral direction. The first lateral distance is equal to or less than twice the second lateral distance.

19 Claims, 8 Drawing Sheets

VERTICAL POWER SEMICONDUCTOR DEVICE AND MANUFACTURING METHOD

TECHNICAL FIELD

The present disclosure is related to semiconductor devices, in particular to vertical power semiconductor devices including a body contact structure.

BACKGROUND

In semiconductor switching devices like IGBTs (insulated gate bipolar transistors) or diodes mobile charge carriers flood a low-doped drift region and form a charge carrier plasma that provides a low on-state resistance. One target of semiconductor device technology lies in the design of semiconductor switching devices having a specified reliability. An impact on the reliability of semiconductor switching devices is given when operating the devices under extreme conditions, e.g. when turning off high overcurrents. Thus, semiconductor device technology development is challenging for meeting target demands on device reliability in view of extreme operation conditions.

There is a need to improve device reliability in vertical power semiconductor devices.

SUMMARY

An example of the present disclosure relates to a vertical power semiconductor device. The vertical power semiconductor device includes a semiconductor body having a first main surface and a second main surface opposite to the first main surface along a vertical direction. The vertical power semiconductor device further includes a gate trench structure at the first main surface. At least part of the gate trench structure extends along a first lateral direction. The vertical power semiconductor device further includes a body region of a first conductivity type directly adjoining the gate trench structure. The vertical power semiconductor device further includes a source region of a second conductivity type directly adjoining the gate trench structure. The vertical power semiconductor device further includes a drift region of the second conductivity type arranged between the body region and the second main surface. The vertical power semiconductor device further includes a body contact structure including a first body contact sub-region and a second body contact sub-region spaced at a first lateral distance along the first lateral direction. Each of the first body contact sub-region and the second body contact sub-region directly adjoins the gate trench structure and has a larger doping concentration than the body region. In a channel region between the first body contact sub-region and the second body contact sub-region the body contact structure has a second lateral distance to the gate trench structure along a second lateral direction perpendicular to the first lateral direction. The first lateral distance is equal to or less than twice the second lateral distance.

Another example of the present disclosure relates to a method of manufacturing a vertical power semiconductor device. The method includes providing a semiconductor body having a first main surface and a second main surface opposite to the first main surface along a vertical direction. The method further includes forming a gate trench structure at the first main surface, wherein at least part of the gate trench structure extends along a first lateral direction. The method further includes forming a body region of a first conductivity type directly adjoining the gate trench structure. The method further includes forming a source region of a second conductivity type directly adjoining the gate trench structure. The method further includes forming a drift region of the second conductivity type arranged between the body region and the second main surface. The method further includes forming a body contact structure including a first body contact sub-region and a second body contact sub-region spaced at a first lateral distance along the first lateral direction, wherein each of the first body contact sub-region and the second body contact sub-region directly adjoins the gate trench structure and has a larger doping concentration than the body region. In a channel region between the first body contact sub-region and the second body contact sub-region the body contact structure has a second lateral distance to the gate trench structure along a second lateral direction perpendicular to the first lateral direction, wherein the first lateral distance is equal to or less than twice the second lateral distance.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a vertical power semiconductor device and a method of manufacturing a vertical power semiconductor device and together with the description serve to explain principles of the embodiments. Further embodiments are described in the following detailed description and the claims.

DETAILED DESCRIPTION

Figure 1A:
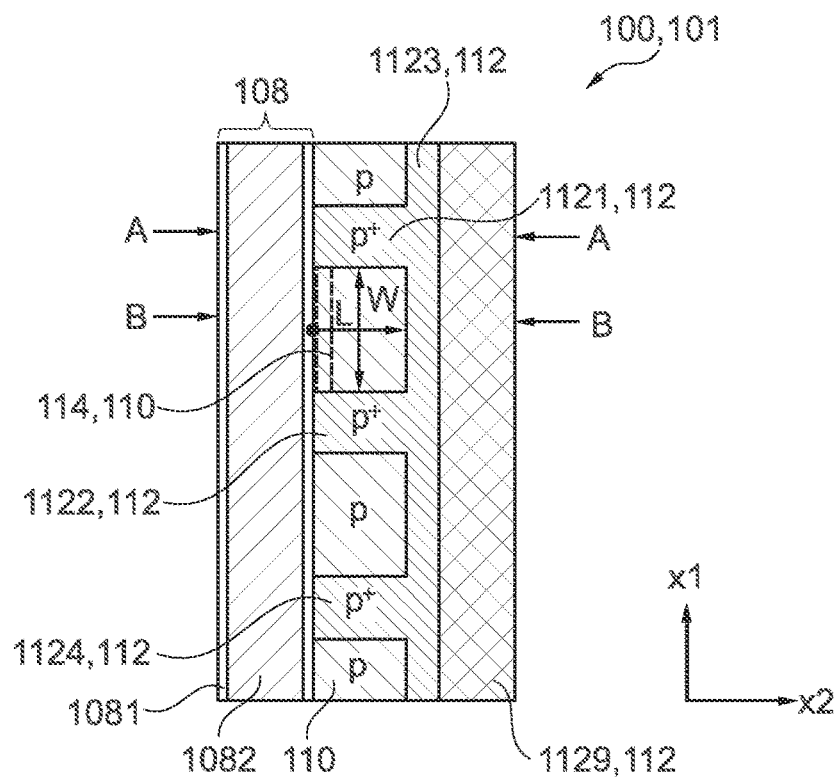
FIGS. 1A to 1C are schematic plan and cross-sectional views for illustrating an example of a vertical power IGBT including a continuous body contact structure and a groove contact.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

The Figures illustrate relative doping concentrations by indicating "−" or "+" next to the doping type "n" or "p". For example, "n-" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a vertical power semiconductor device may include a semiconductor body having a first main surface and a second main surface opposite to the first main surface along a vertical direction. The vertical power semiconductor device may further include a gate trench structure at the first main surface. At least part of the gate trench structure may extend along a first lateral direction. The vertical power semiconductor device may further include a body region of a first conductivity type directly adjoining the gate trench structure. The vertical power semiconductor device may further include a source region of a second conductivity type directly adjoining the gate trench structure. The vertical power semiconductor device may further include a drift region of the second conductivity type arranged between the body region and the second main surface. The vertical power semiconductor device may further include a body contact structure including a first body contact sub-region and a second body contact sub-region spaced at a first lateral distance along the first lateral direction. Each of the first body contact sub-region and the second body contact sub-region may directly adjoin the gate trench structure and may have a larger doping concentration than the body region. In a channel region between the first body contact sub-region and the second body contact sub-region the body contact structure may have a second lateral distance to the gate trench structure along a second lateral direction perpendicular to the first lateral direction. The first lateral distance may be equal to or less than twice the second lateral distance.

The vertical power semiconductor device may be a power semiconductor IGBT (insulated gate bipolar transistor), or a power semiconductor reverse conducting (RC) IGBT or a power semiconductor transistor such as a power semiconductor IGFET (insulated gate field effect transistor, e.g. a metal oxide semiconductor field effect transistor). The vertical power semiconductor device may be configured to conduct currents of more than 1 A or more than 10 A or even more than 30 A and may be further configured to block voltages between load terminals, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

For example, the gate trench structure may include an electrode, e.g. a gate electrode as at least part of the electrode, and a dielectric, e.g. a gate dielectric as at least part of the dielectric in a gate trench. The dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. The electrode may include one electrode material or a combination of electrode materials, for example a doped semiconductor material (e.g., a highly doped semiconductor material) such as doped polycrystalline silicon, metal or metal compounds. The gate trench structure may include one or a plurality of parts that extend along different lateral directions. For example, the gate trench structure may be stripe-shaped and extend along the first lateral direction. The first lateral direction may be a direction that is perpendicular to the vertical direction, e.g. a direction that extends in parallel to the first main surface. In case the gate trench structure includes a plurality of parts that extend along different lateral directions, the lateral direction of each part may define a longitudinal direction of the respective part of the gate trench structure, for example.

The source region may adjoin the gate trench structure at one or at both of opposite sidewalls of a gate trench, for example.

For example, an impurity concentration in the drift region may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $5 \times 10^{12}$ cm$^{-3}$ and $1 \times 10^{15}$ cm$^{-3}$, for example in a range from $1 \times 10^{13}$ cm$^3$ to $2 \times 10^{14}$ cm$^{-3}$. In the case of a semiconductor device based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at the second main surface of the semiconductor body. In this manner, the drift or base region may be formed using desired low doping levels and with a desired thickness while achieving soft switching for the semiconductor device thus formed.

For example, the body contact structure may include a contact, e.g. a metal contact such as a contact plug directly adjoining the first main surface of the semiconductor body, and a plurality of doped body contact sub-regions. Some or all of the body contact sub-regions in a mesa region may be laterally separated from one another. The mesa region is laterally confined by opposite trench structures. In addition or as an alternative, some or all of the body contact sub-regions in a mesa region may be merged to form a continuous body contact structure or may form a continuous part of the body contact structure. For example, some or all of the body contact sub-regions may be stripe-shaped along the second lateral direction.

For example, a maximum doping concentration of some or all of the body contact sub-regions may be larger than a maximum doping concentration of the body region. A vertical doping concentration profile of the body contact sub-regions may also differ from the vertical doping concentration of the body region.

The second lateral distance between the body contact structure and the gate trench structure along the second lateral may be a distance between a gate dielectric of the gate trench structure and a body contact sub-region, for example. As an alternative, the second lateral distance between the body contact structure and the gate trench structure along the second lateral may also be a distance between a gate dielectric of the gate trench structure and a contact, e.g. a planar contact of the body contact structure, for example.

When turning off high currents, e.g. overcurrents, carriers originating from below the gate trench in the middle between the first and second body contact sub-regions have to reach the contact. By setting the first lateral distance equal to or less than twice the second lateral distance in a channel region between the first body contact sub-region and the second body contact sub-region, the voltage drop caused by the carriers flowing from the middle between the first and second body contact sub-regions to the contact may be reduced in view of two current paths along the first lateral direction, one current path from the middle to the first body contact sub-region and another current path from the middle toward the second body contact sub-region. The voltage drop reduction is achieved by splitting the current path into two current paths compared to a single current path along the second lateral direction in cases where the current paths along the first lateral direction are not attractive for the carriers in view of the path resistance. A reduction of the voltage drop allows for an increase of latch-up robustness, and thus, device reliability can be improved in vertical power semiconductor devices.

For example, the source region may include a plurality of source sub-regions spaced from one another along the first lateral direction. One of the plurality of source sub-regions may be arranged between the first body contact sub-region and the second body contact sub-region. The plurality of source sub-regions may extend as stripe-shaped segments parallel to each other along the second lateral direction, for example. Since the body contact sub-regions, e.g. the first and second body contact sub-regions, are not electrically compensated or counter-doped by the source region, a higher number of activated doping in the body contact sub-regions can contribute to discharge carriers during turn off of overcurrents, for example. This may lead to a further improvement of latch-up robustness, for example.

For example, a part of the body region may be arranged, along the first lateral direction, between the first body contact sub-region and the one of the plurality of source sub-regions. This renders the effective channel width independent of a possible misalignment between the one of the plurality of source sub-regions and the first body contact sub-region.

For example, the first body contact sub-region may extend, along the vertical direction from the first main surface, deeper into the semiconductor body than the source region. This may allow for increasing the conductivity when discharging carriers during turn off of over-currents below areas where the source region is present, for example.

For example, a part of the source region may be arranged between a part of the body contact structure and the first main surface. In this case the contact to the source region and the body contact structure may have a distance to the gate trench structure larger than the second lateral distance.

For example, the source region may extend, along the vertical direction from the first main surface, deeper into the semiconductor body than the first body contact sub-region, or may extend to a same depth as the first body contact sub-region.

For example, the body contact structure may further include a third body contact sub-region merging the first body contact sub-region and the second body contact sub-region. A lateral distance between the gate trench structure and the third body contact sub-region along the second lateral direction may be equal to the second lateral distance. For example, the third body contact sub-region may directly adjoin a planar contact at the first main surface or may directly adjoin a contact groove. The third body contact sub-region may allow for an improved carrier discharge during turn off of large currents by optimizing current paths in view of latch-up robustness, for example.

For example, the body contact structure may further include a contact in a contact groove. The third body contact sub-region may directly adjoin a side surface part of the contact. The contact groove may extend into the semiconductor body from the first main surface. The third body contact region sub-region may also adjoin a bottom side of the contact groove, for example. The contact groove may allow for improving a contact surface area to both the body contact region and the source region, for example. Thus, an electric contact resistance may be lowered, for example.

For example, the source region may directly adjoin a side surface of the contact in the contact groove.

For example, a bottom of the contact may adjoin an electrode in a trench structure, e.g. an auxiliary trench structure. The electrode in the trench structure may be separated from the body region by a dielectric in the same or a similar way as the gate electrode. The electrode in the trench structure may be different from the gate electrode, for example. For example, the electrode in the trench structure may be electrically connected to the source region, e.g. by a source contact area. The electrode may also be electrically connected to a reference voltage output, for example. This may allow for a compact electrical connection of various structural elements, e.g. the body region, the source region and the electrode.

For example, the vertical semiconductor power device may further include a barrier region of the first or second conductivity type arranged between the body region and the drift region. For example, the barrier region may be a barrier region of the first conductivity type arranged in a mesa region between the body region and a bottom the trench gate structure or partly below the trench gate structure. The barrier region of the first conductivity type and the body region may be vertically spaced. The barrier may allow for improving device robustness, for example. In addition or as an alternative, the barrier region may be a barrier region of the second conductivity type arranged in a mesa region between the body region and a bottom the trench gate structure. The barrier region of the second conductivity type and the body region may be vertically spaced or directly adjoin one another, for example. The barrier may allow for increasing the carrier concentration during on-state of the device, for example.

For example, the body contact structure may further include a contact. The contact may be a planar contact having a lateral distance to the gate trench structure along the second lateral direction that is equal to the second lateral distance.

For example, the vertical power semiconductor device may further comprise a plurality of channel regions spaced from one another along the first lateral direction. All or some of the plurality of channel regions may be arranged between body contact sub-regions of the body contact structure along the first lateral direction. Thus, along a longitudinal direction of a straight portion of the gate trench structure all or some of the plurality of channel regions may each be arranged between neighboring two of body contact sub-regions, for example. The channel regions may be parts of the body region directly adjoining the gate trench structure, and the channel regions may further directly adjoin a bottom side of the source region, for example.

For example, the vertical power semiconductor device may further include a plurality of transistor cells. The plurality of transistor cells may have one or more of a stripe-shaped cell design, a square cell design or a polygonal cell design. The plurality of transistor cells may share a common first load electrode, e.g. a source electrode or emitter electrode. Thus, the plurality of transistor cells is electrically connected in parallel.

For example, at least part of the gate trench structure extends along the second lateral direction. The body contact structure may directly adjoin a part of the gate trench structure extending along the first lateral direction and a part of the gate trench structure extending along the second lateral direction. Thus, effective carrier discharge during turn off of large currents may be out carried out in differently oriented segments of vertical power semiconductor transistors having square cell design or a polygonal cell design.

For example, the plurality of transistor cells may be insulated gate bipolar transistor cells, IGBT cells, or reverse conducting insulated gate bipolar transistor cells, RC-IGBT cells.

For example the source region may directly adjoin the gate trench structure on only one of opposite sidewalls. Thus, a channel region may only be formed on the one of opposite sidewalls of the gate trench structure. For example the body contact structure may directly adjoin a sidewall of another trench structure opposite to the gate trench structure.

For example, a method of manufacturing a vertical power semiconductor device may include providing a semiconductor body having a first main surface and a second main surface opposite to the first main surface along a vertical direction. The method may further include forming a gate trench structure at the first main surface. At least part of the gate trench structure may extend along a first lateral direction. The method may further include forming a body region of a first conductivity type directly adjoining the gate trench structure. The method may further include forming a source region of a second conductivity type directly adjoining the gate trench structure. The method may further include forming a drift region of the second conductivity type arranged between the body region and the second main surface. The method may further include forming a body contact structure including a first body contact sub-region and a second body contact sub-region spaced at a first lateral distance along the first lateral direction. Each of the first body contact sub-region and the second body contact sub-region may directly adjoin the gate trench structure and may have a larger doping concentration than the body region. In a channel region between the first body contact sub-region and the second body contact sub-region, the body contact structure may have a second lateral distance to the gate trench structure along a second lateral direction perpendicular to the first lateral direction. The first lateral distance may be equal to or less than twice the second lateral distance.

The examples and features described above and below may be combined.

In the following, further examples of vertical power semiconductor devices and manufacturing methods are explained in connection with the accompanying drawings. Functional and structural details described with respect to the examples above shall likewise apply to the exemplary embodiments illustrated in the figures and described further below.

Figures 1B, 1C:
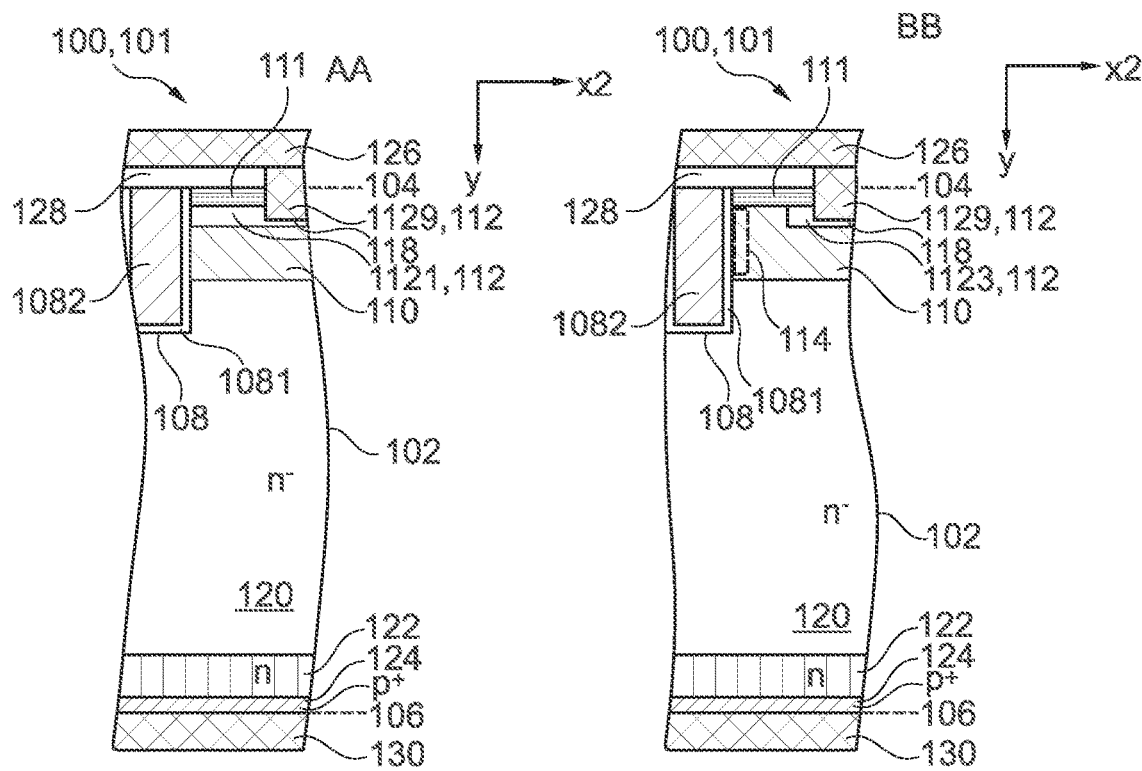

FIG. 1A is a schematic plan view illustrating an embodiment of an insulated gate bipolar transistor, IGBT 101, as an example of a vertical power semiconductor device 100. FIG. 1B is a schematic cross-sectional view along intersection line AA of FIG. 1A. FIG. 1C is a schematic cross-sectional view along intersection line BB of FIG. 1A.

Referring to the schematic views of FIGS. 1A to 1C, the IGBT 101 includes a semiconductor body 102 having a first main surface 104 and a second main surface 106 opposite to the first main surface 104 along a vertical direction y.

A gate trench structure 108 is formed at the first main surface 104. At least part of the gate trench structure 108 extends along a first lateral direction x1. The first lateral direction x1 may be a longitudinal direction of a segment of the gate trench structure 108. The gate trench structure includes a gate dielectric 1081 and a gate electrode 1082.

A p-doped body region 110 directly adjoins the gate trench structure 108. An n$^+$-doped source region 111 directly adjoins the gate trench structure (not shown in FIG. 1A for simplicity). An n$^-$-doped drift region 120 is arranged between the p-doped body region 110 and the second main surface 106. An n-doped field stop region 122 is arranged between the n-doped drift region 120 and the second main surface 106. A p$^+$-doped region 124, e.g. a semiconductor substrate and/or a rear side emitter region of the IGBT 101, is arranged between the field stop region 122 and the second main surface 106.

A p$^+$-doped body contact structure 112 includes a first p$^+$-doped body contact sub-region 1121 and a second p$^+$-doped body contact sub-region 1122 spaced at a first lateral distance W along the first lateral direction x1. Each of the first p$^+$-doped body contact sub-region 1121 and the second p$^+$-doped body contact sub-region 1122 directly adjoin the gate trench structure 108 and has a larger doping concentration than the p-doped body region 110.

In a channel region 114 of the body region 110 between the first p$^+$-doped body contact sub-region 1121 and the second p$^+$-doped body contact sub-region 1122, the p-doped body contact structure 112 has a second lateral distance L to the gate trench structure 108 along a second lateral direction x2 perpendicular to the first lateral direction x1. The first lateral distance W is equal to or less than twice the second lateral distance L or less than 1.5 times the second lateral distance L or even equal to or less than the second lateral distance L. The channel region 114 is a part of the p-doped body region 110 that directly adjoins the gate trench structure 108. The conductivity in the channel region may be controlled by a gate voltage applied to the gate electrode, for example.

The p$^+$-doped body contact structure 112 further includes a third p$^+$-doped body contact sub-region 1123 merging the first p$^+$-doped body contact sub-region 1121 and the second p$^+$-doped body contact sub-region 1122. A lateral distance between the gate trench structure 108 and the third p$^+$-doped body contact sub-region 1123 along the second lateral direction x2 is equal to the second lateral distance L.

The first p$^+$-doped body contact sub-region 1121 extends, along the vertical direction y from the first main surface 104, deeper into the semiconductor body 102 than the source region 111. A part of the source region 111 is arranged between a part of the body contact structure 112 and the first main surface 104.

The p$^+$-doped body contact structure 112 further includes a contact 1129 in a contact groove 118. The third p$^+$-doped body contact sub-region 1123 directly adjoins a side surface part of the contact 1129.

The contact 1129 turns into a first load electrode 126, e.g. an emitter electrode or source electrode. An interlayer dielectric 128 is arranged between the first load electrode 126 and the first main surface 104.

A second load electrode 130, e.g. a collector electrode directly adjoins and electrically connects the p$^+$-doped region 124 at the second main surface 106.

Figure 2A:
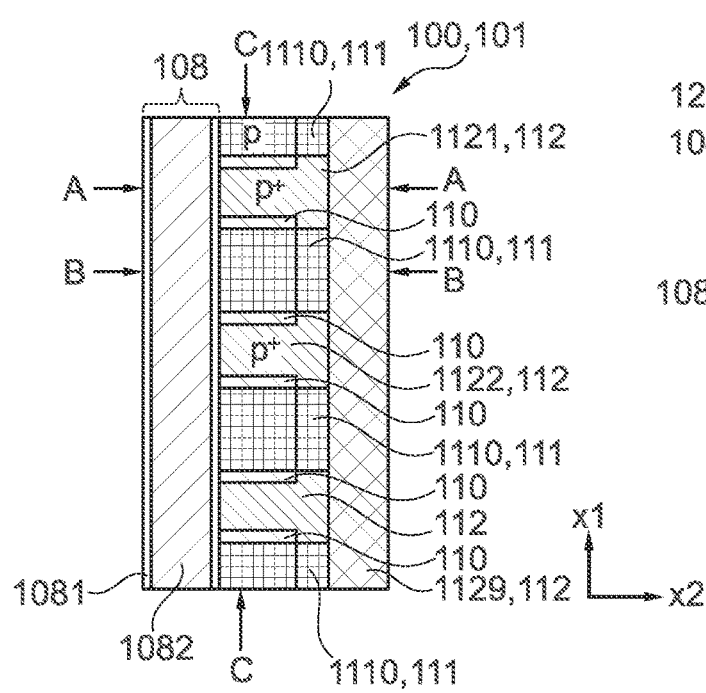
FIGS. 2A to 2D are schematic plan and cross-sectional views for illustrating another example of a vertical power IGBT including a body contact structure with body contact sub-regions and a groove contact and separated source sub-regions.
Figure 2B:
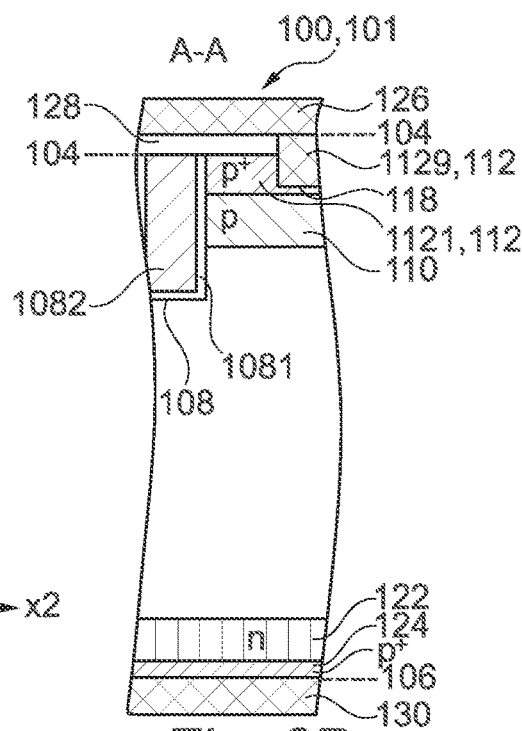
Figure 2C:
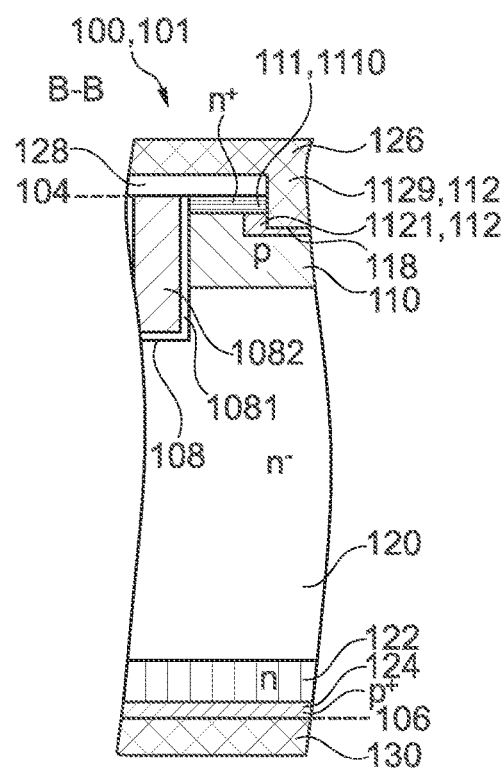
Figure 2D:
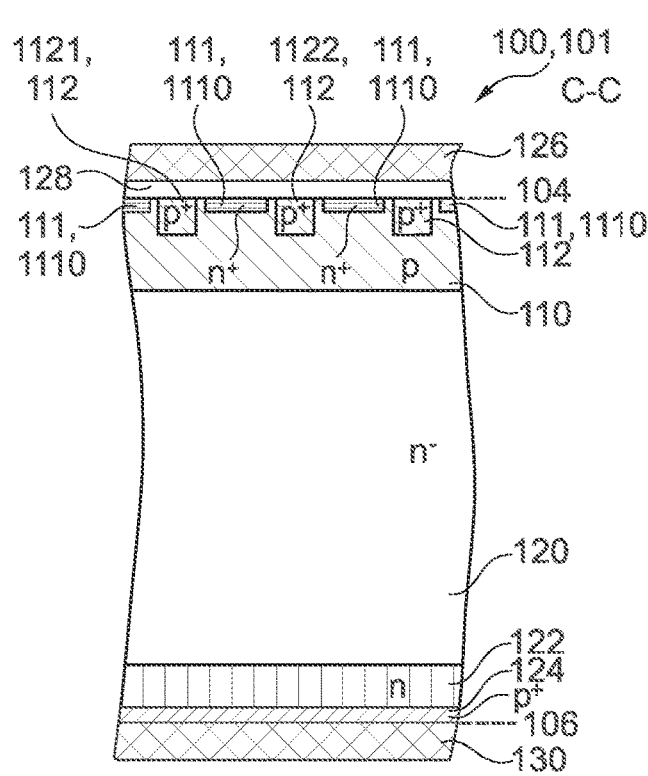

FIG. 2A is a schematic plan view illustrating another embodiment of an insulated gate bipolar transistor, IGBT 101, as an example of a vertical power semiconductor device 100. FIG. 2B is a schematic cross-sectional view along intersection line AA of FIG. 2A. FIG. 2C is a schematic cross-sectional view along intersection line BB of FIG. 2A. FIG. 2D is a schematic cross-sectional view along intersection line CC of FIG. 2A.

The IGBT 101 illustrated in FIGS. 2A to 2D has structural and functional elements with the IGBT 101 illustrated in FIGS. 1A to 1C in common. For avoiding repetition of description of such common structural and functional elements, explanations above with reference to the embodiment of FIGS. 1A to 1C likewise apply to the embodiment illustrated in FIGS. 2A to 2D.

Referring to the schematic views of FIGS. 2A to 2D, the IGBT 101 includes a plurality of source sub-regions 1110 spaced from one another along the first lateral direction x1. One of the plurality of source sub-regions 1110 is arranged between the first body contact sub-region 1121 and the second body contact sub-region 1122.

In the embodiment illustrated in FIGS. 2A to 2D, the body contact sub-regions, e.g. the first p$^+$-doped body contact sub-region 1121 and the second p$^+$-doped body contact sub-region 1122 are spaced from one another along the first lateral direction x1. For example, the body contact sub-regions may be merged by the third body contact sub-region 1123 as illustrated in FIG. 1A, for example.

A part of the body region 110 is arranged, along the first lateral direction x1, between the first body contact sub-region 1121 and the one of the plurality of source sub-regions.

Figure 3A:
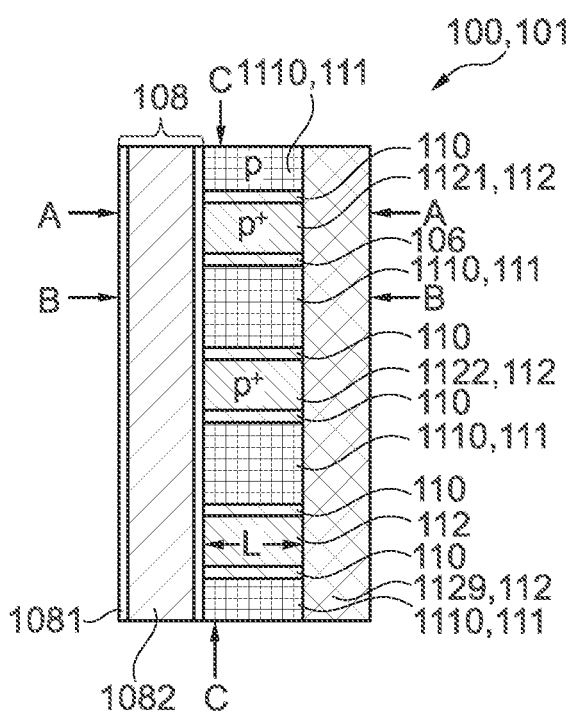
FIGS. 3A to 3D are schematic plan and cross-sectional views for illustrating another example of a vertical power IGBT including a planar contact.
Figure 3B:
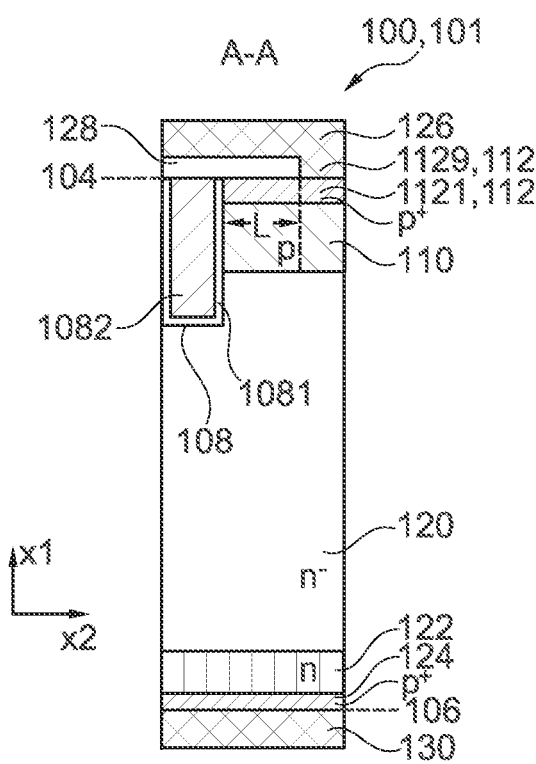
Figure 3C:
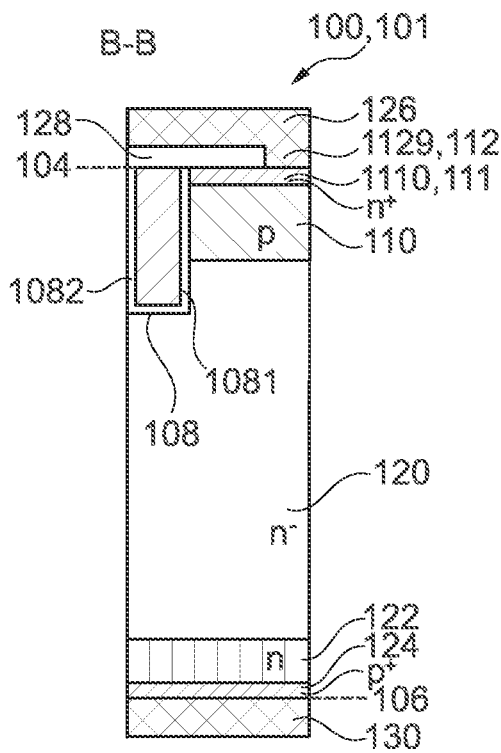
Figure 3D:
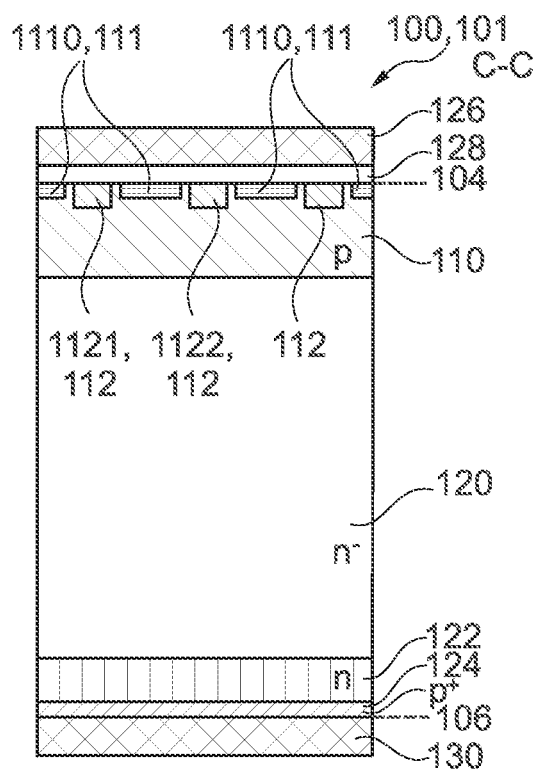

FIG. 3A is a schematic plan view illustrating another embodiment of an insulated gate bipolar transistor, IGBT 101, as an example of a vertical power semiconductor device 100. FIG. 3B is a schematic cross-sectional view along intersection line AA of FIG. 3A. FIG. 3C is a schematic cross-sectional view along intersection line BB of FIG. 3A. FIG. 3D is a schematic cross-sectional view along intersection line CC of FIG. 3A.

The IGBT 101 illustrated in FIGS. 3A to 3D has structural and functional elements with the IGBT 101 illustrated in FIGS. 1A to 1C in common. For avoiding repetition of description of such common structural and functional elements, explanations above with reference to the embodiment of FIGS. 1A to 1C likewise apply to the embodiment illustrated in FIGS. 3A to 3D.

Referring to the schematic views of FIGS. 3A to 3D, the contact 1129 of the body contact structure 112 is a planar contact having a lateral distance to the gate trench structure 108 along the second lateral direction x2 that is equal to the second lateral distance L.

Figures 4A, 4B:
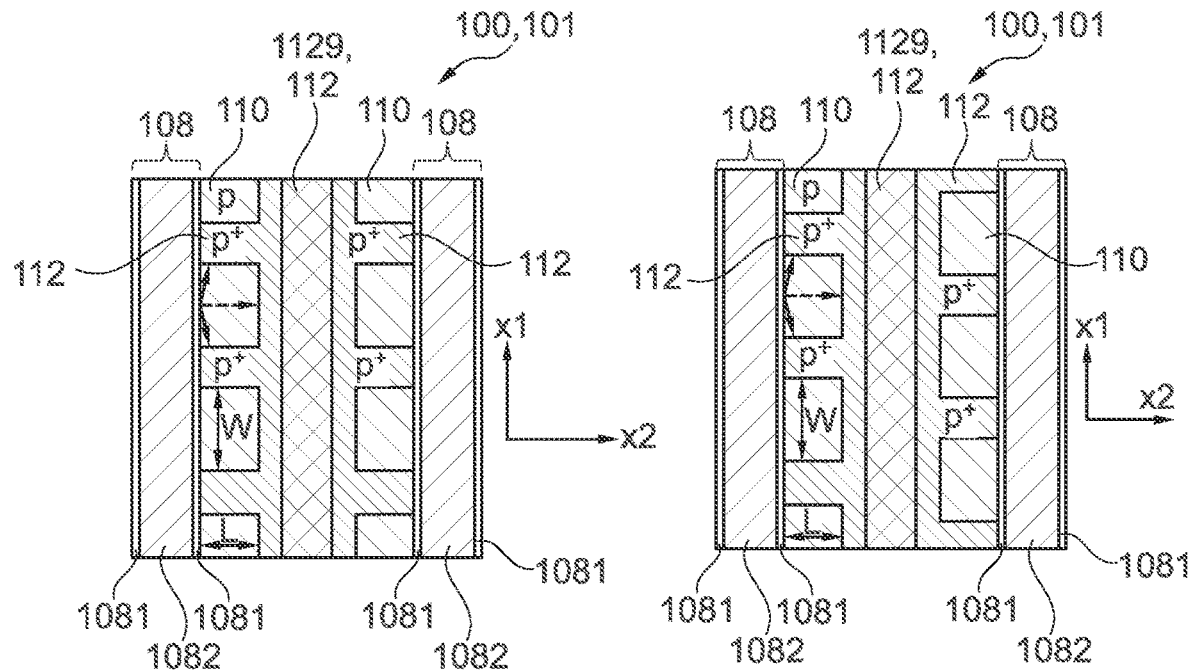
FIGS. 4A to 4C are schematic plan and cross-sectional views for illustrating examples of body contact structure designs.
Figure 4C:
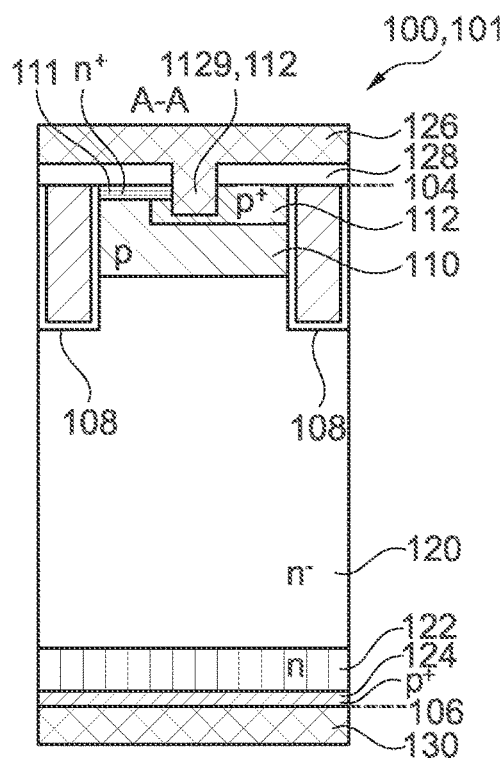

FIGS. 4A and 4B are schematic plan views illustrating other embodiments of an insulated gate bipolar transistor, IGBT 101, as an example of a vertical power semiconductor device 100. FIG. 4C is a schematic cross-sectional view along intersection line AA of FIG. 4A.

Referring to the schematic view of FIG. 4A, the body contact structure 112 between opposite gate trench structures 108 can be divided into a first part between a first gate trench structure 108, e.g. the gate trench structure at the left of FIG. 4A, 4B, and the contact 1129, and a second part between a second gate trench structure 108, e.g. the gate trench structure at the right of FIG. 4A, 4B, and the contact 1129. In the embodiment illustrated in FIG. 4A, the first and second parts are symmetrically arranged with respect to the contact 1129. In the embodiment illustrated in FIGS. 4B, 4C, the first and second parts are additionally offset along the first lateral direction x1 when compared to the arrangement illustrated in FIG. 4A.

FIGS. 5A to 5F are schematic plan views illustrating embodiments of closed cell geometries of insulated gate bipolar transistors 101.

In the embodiments illustrated in FIGS. 5A to 5D, a square cell design (FIGS. 5A, 5C) and a square cell design with rounded corners (FIGS. 5B, 5D) is used. The contact 1129 may be a contact in a contact groove or a planar contact. Illustration of the source region 111 is omitted in FIGS. 5A, 5B and supplemented in FIGS. 5C, 5D. In the embodiments illustrated in FIGS. 5A to 5D, a first part of the gate trench structure 108 extends along the first lateral direction x1, and a second part of the gate trench structure 108 extends along the second lateral direction x2. The body contact structure 112 directly adjoins the first and second parts of the gate trench structure 108, respectively.

Figure 5A:
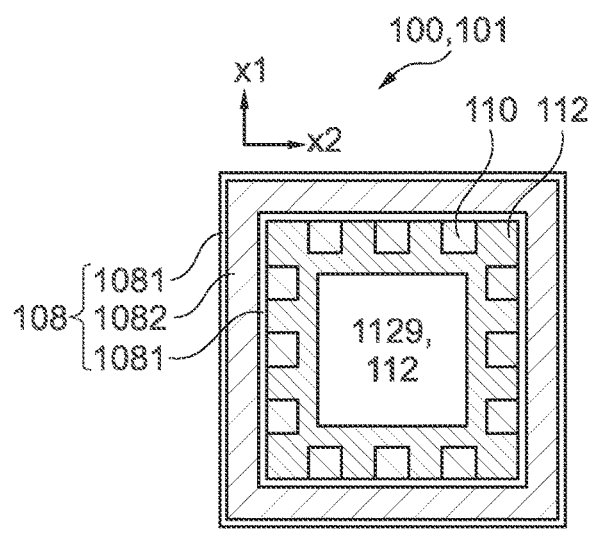
FIGS. 5A to 5F are schematic plan views for illustrating examples of square and polygonal IGBT cell designs.
Figure 5B:
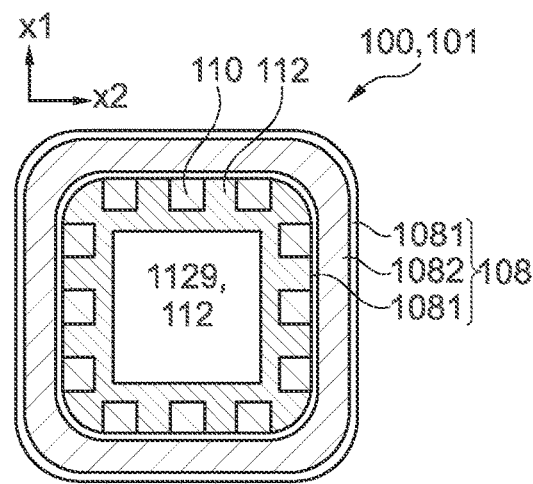
Figure 5C:
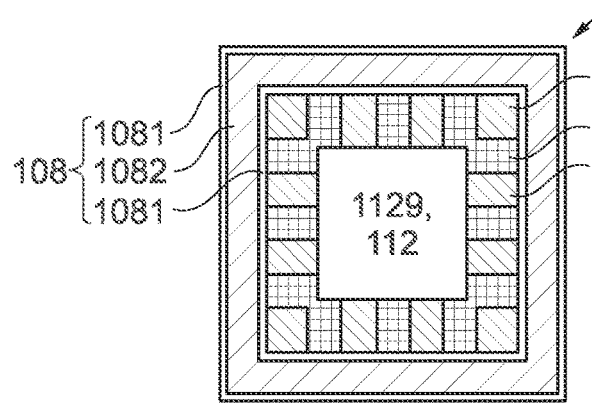
Figure 5D:
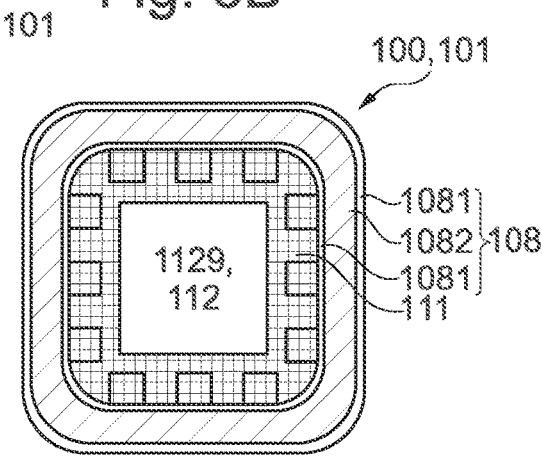
Figure 5E:
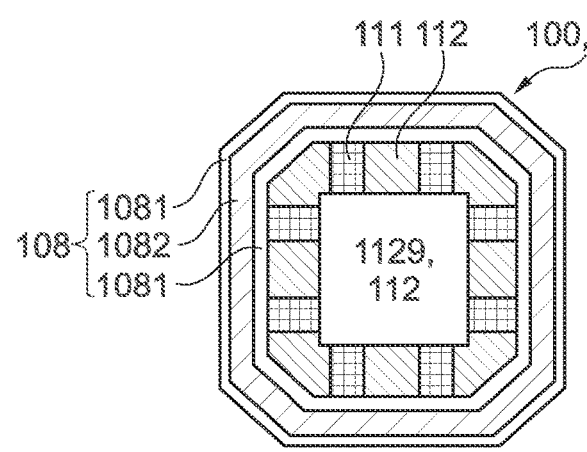
Figure 5F:
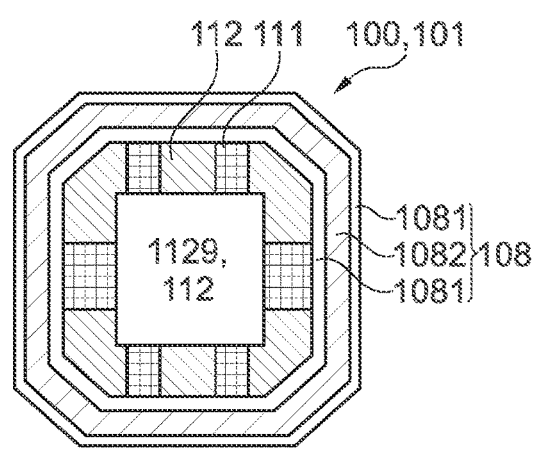

In the embodiments illustrated in FIGS. 5E to 5F, a polygonal cell design, e.g. octagonal cell design is used. The contact 1129 may be a contact in a contact groove or a planar contact.

In the embodiments illustrated in FIGS. 5A to 5F, number and widths of the source regions 111 and/or channel regions may differ from one another. For example, a number of channel regions at a part of the gate trench structure 108 extending along the first lateral direction x1 may be different from a number of channel regions of another part of the gate trench structure 108 extending along the second lateral direction x2.

The transistor cells described with reference to the embodiments above may be integrated in a transistor area. Examples of transistor areas are described with reference to the figures below.

Figure 6:
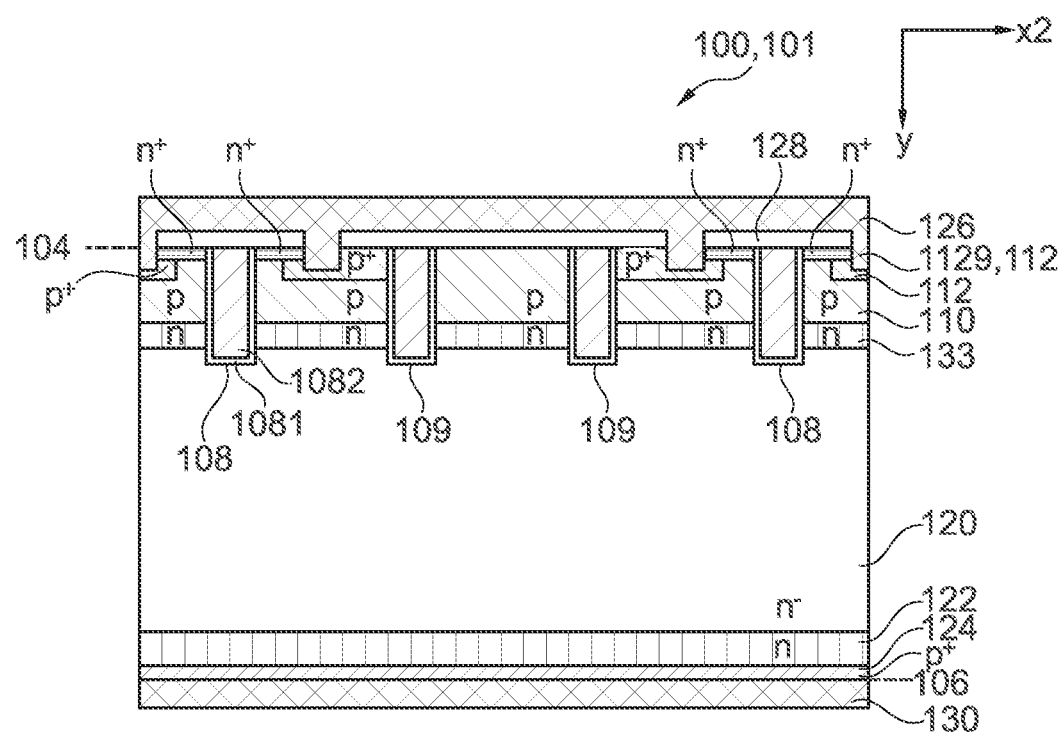
FIGS. 6 to 12 are schematic cross-sectional views for illustrating examples of IGBT transistor areas including gate trench structures and auxiliary trench structures.

Referring to the schematic cross-sectional view of FIG. 6, the IGBT 101 includes, in addition to the gate trench structures 108 and transistor cell designs as described above, auxiliary trench structures 109 that are integrated into the transistor area. The auxiliary trench structures 109 may include electrodes electrically connected to another potential than a potential of the gate electrode, for example. The electrodes in the auxiliary trench structures 109 may be electrically connected to one or more of a source potential, a reference voltage output, a resistive or capacitive voltage divider, for example. In a mesa region between the additional auxiliary trench structures 109, one or more of channel regions, source regions, body contact regions may be omitted, for example.

The IGBT 101 further includes an n-doped barrier region 133 of the arranged between the body region 110 and the drift region 120.

Figure 7:
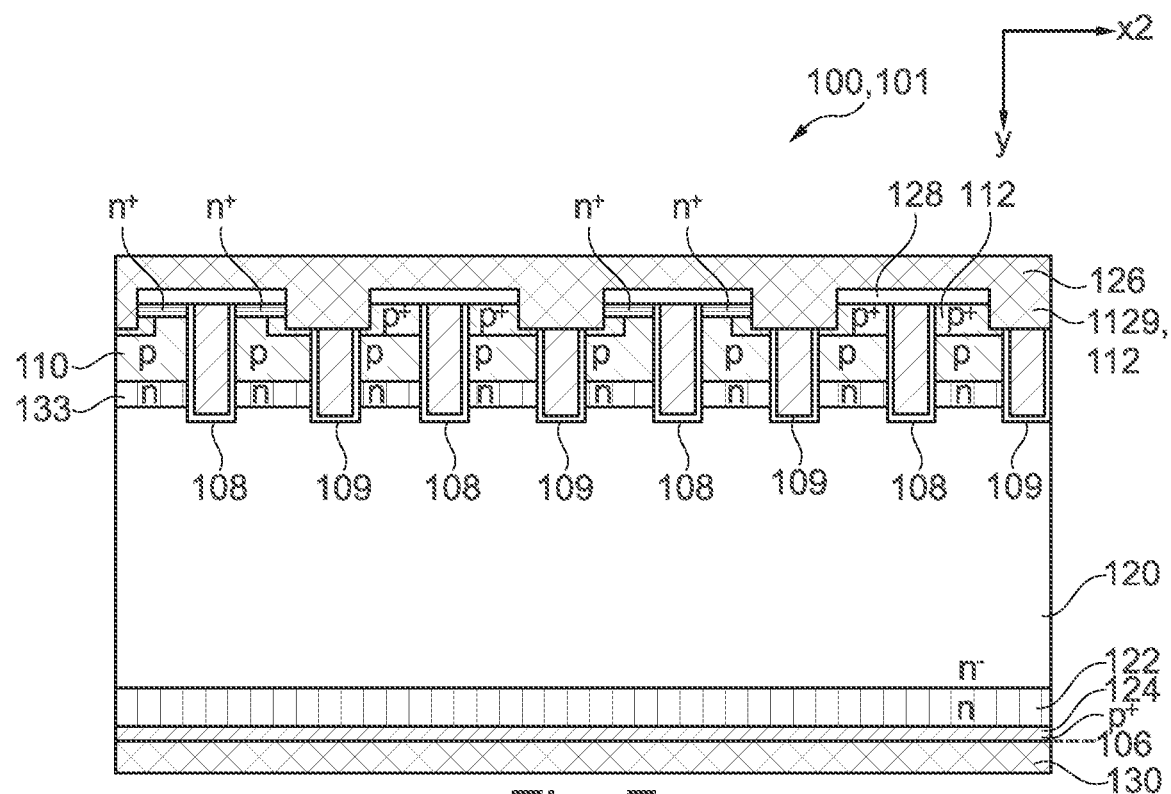
Figure 8:
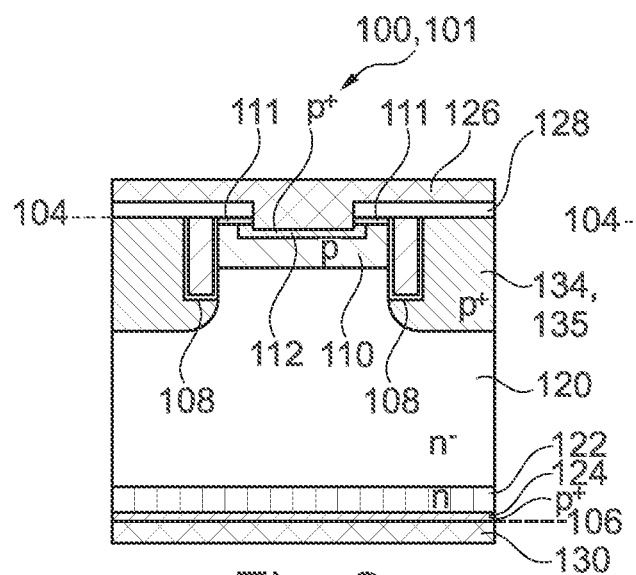
Figure 9:
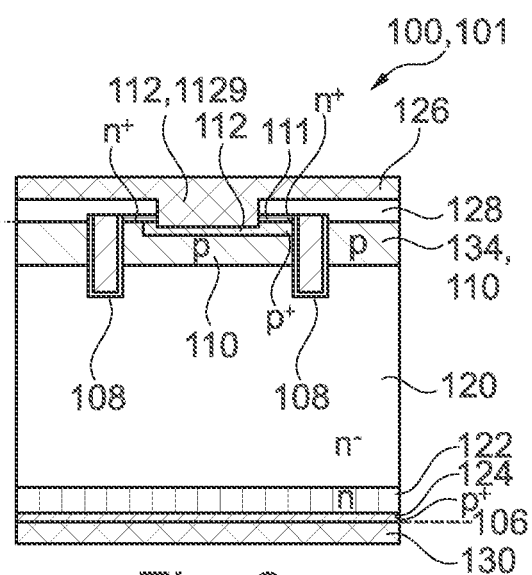
Figure 10:
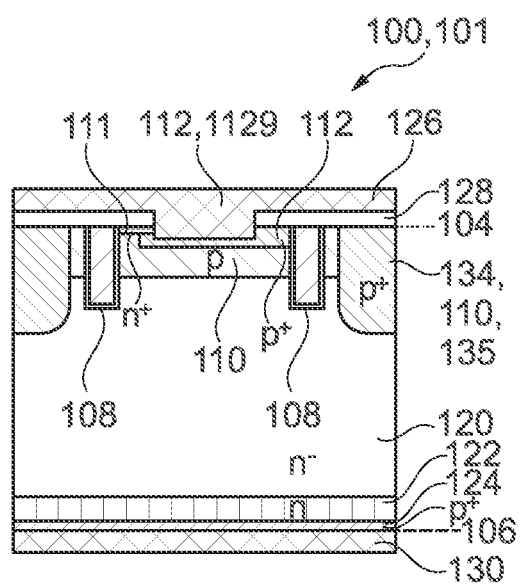
Figure 11:
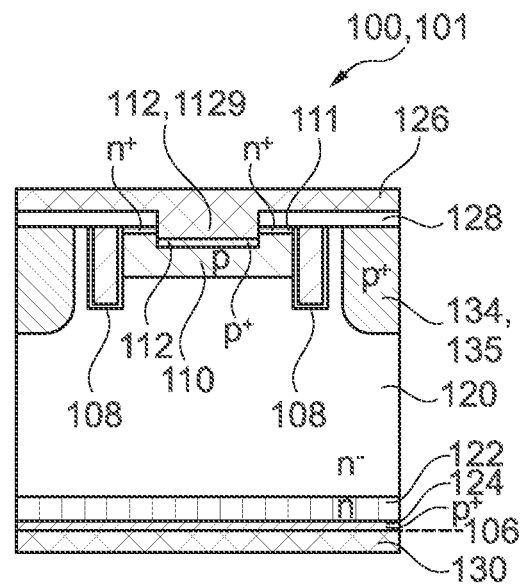

Referring to the schematic cross-sectional view of FIG. 7, the auxiliary trench structures 109 are recessed and a width of the contact 1129 of the body contact structure 112 is enlarged. Thereby, the contact 1129 is not only electrically connected to the body contact structure 112 and the source region 111, but also to the electrode of the auxiliary trench structure 109. This may allow for improving compact transistor area design, for example.

The schematic cross-sectional views of FIGS. 8 to 11 are exemplary cross-sectional views of square or polygonal IGBT cell designs as illustrated in FIGS. 5A to 5F, or of stripe-shaped cell designs. The IGBT cells may be surrounded by a p-doped structure 134 that may be electrically floating or connected to an emitter potential, e.g. to the first load electrode 126. The p-doped structure 134 may be, at least in part, formed concurrently with the body region 110, for example. The p-doped structure 134 may also include a deep p-well 135, for example.

Figure 12:
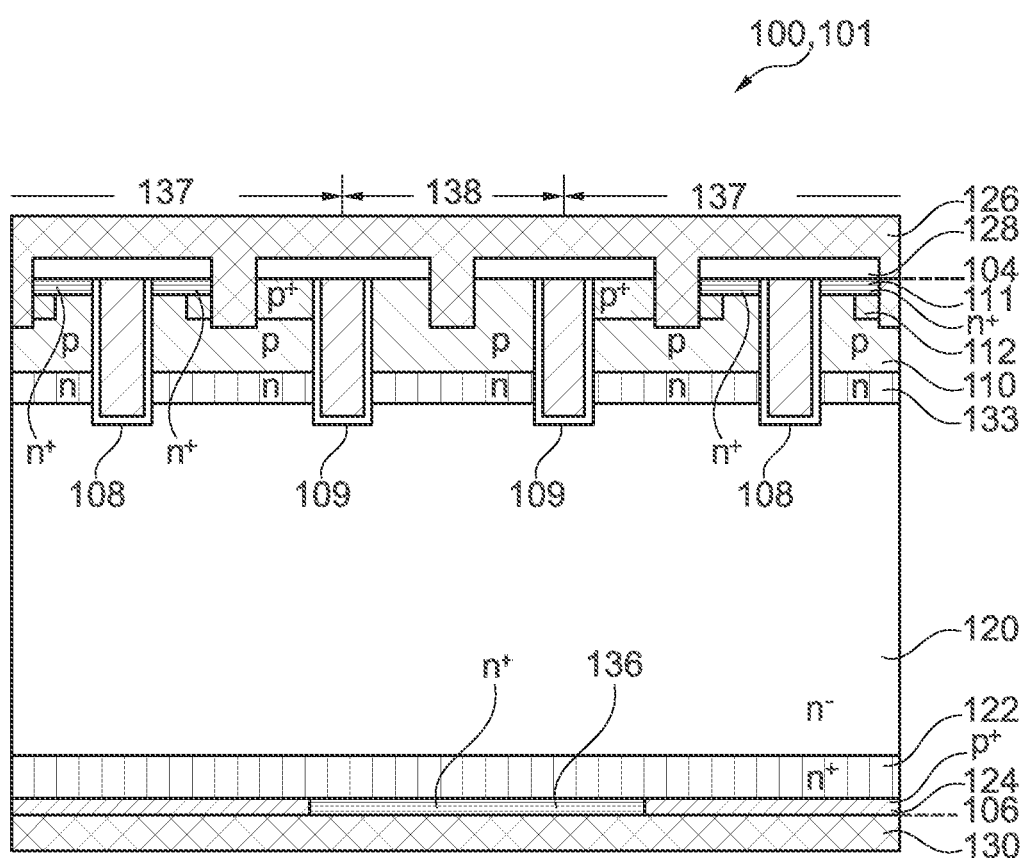

In the schematic cross-sectional view of FIG. 12, a reverse conducting, RC IGBT 101 is illustrated. In the RC IGBT 101 of FIG. 12, one or more n$^+$-doped regions 136 are arranged between p$^+$-doped regions 124 at the second main surface 106. Moreover, the contact 1129 is formed as a deep groove contact extending at least as deep into the semiconductor body 102 as the body contact structure 112. Thereby, an emitter efficiency of p-doped regions at the first main surface 104 may be reduced, for example. The RC IGBT 101 may include RC IGBT cells 137 intermixed with diode cells 138. In the diode cells, channel regions are omitted and these cells are configured to act as diodes connected in parallel to the RC IGBT cells 137.

The aspects and features mentioned and described together with one or more of the previously described examples and figures, may as well be combined with one or more of the other examples in order to replace a like feature of the other example or in order to additionally introduce the feature to the other example. For example, the previous examples described with reference to IGBTs may be applied to RC IGBTs by including the RC functionality into the IGBT as illustrated at the second main surface 106 of FIG. 12, for example.

Conductivity type of the doped regions illustrated in the examples above may also be reversed, i.e. a region illustrated as n-doped may be p-doped, and a region illustrated as p-doped may be n-doped, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical power semiconductor device, comprising:
   a semiconductor body having a first main surface and a second main surface opposite to the first main surface along a vertical direction;
   a gate trench structure at the first main surface, wherein at least part of the gate trench structure extends along a first lateral direction;
   a body region of a first conductivity type directly adjoining the gate trench structure;
   a source region of a second conductivity type directly adjoining the gate trench structure;
   a drift region of the second conductivity type arranged between the body region and the second main surface; and
   a body contact structure including a first body contact sub-region and a second body contact sub-region spaced at a first lateral distance along the first lateral direction,
   wherein each of the first body contact sub-region and the second body contact sub-region directly adjoins the gate trench structure and has a larger doping concentration than the body region,
   wherein in a channel region between the first body contact sub-region and the second body contact sub-region, the body contact structure has a second lateral distance to the gate trench structure along a second lateral direction perpendicular to the first lateral direction,
   wherein the first lateral distance is equal to or less than twice the second lateral distance.

2. The vertical power semiconductor device of claim 1, wherein the source region includes a plurality of source sub-regions spaced from one another along the first lateral direction, and wherein one of the plurality of source sub-regions is arranged between the first body contact sub-region and the second body contact sub-region.

3. The vertical power semiconductor device of claim 2, wherein a part of the body region is arranged, along the first lateral direction, between the first body contact sub-region and the one of the plurality of source sub-regions.

4. The vertical power semiconductor device of claim 1, wherein the first body contact sub-region extends, along the vertical direction from the first main surface, deeper into the semiconductor body than the source region.

5. The vertical power semiconductor device of claim 4, wherein a part of the source region is arranged between a part of the body contact structure and the first main surface.

6. The vertical power semiconductor device of claim 1, wherein the source region extends, along the vertical direction from the first main surface, deeper into the semiconductor body than the first body contact sub-region, or extends to a same depth as the first body contact sub-region.

7. The vertical power semiconductor device of claim 1, wherein the body contact structure further includes a third body contact sub-region merging the first body contact sub-region and the second body contact sub-region, wherein a lateral distance between the gate trench structure and the third body contact sub-region along the second lateral direction is equal to the second lateral distance.

8. The vertical power semiconductor device of claim 7, wherein the body contact structure further includes a contact in a contact groove, and wherein the third body contact sub-region directly adjoins a side surface part of the contact.

9. The vertical power semiconductor device of claim 8, wherein the source region directly adjoins a side surface of the contact in the contact groove.

10. The vertical power semiconductor device of claim 8, wherein a bottom of the contact adjoins an electrode in a trench structure.

11. The vertical power semiconductor device of claim 1, further comprising:
a barrier region of the first or second conductivity type arranged between the body region and the drift region.

12. The vertical power semiconductor device of claim 1, wherein the body contact structure further includes a contact, and wherein the contact is a planar contact having a lateral distance to the gate trench structure along the second lateral direction that is equal to the second lateral distance.

13. The vertical power semiconductor device of claim 1, further comprising a plurality of channel regions spaced from one another along the first lateral direction, wherein all or some of the plurality of channel regions are arranged between body contact sub-regions of the body contact structure along the first lateral direction.

14. The vertical power semiconductor device of claim 1, wherein the vertical power semiconductor device includes a plurality of transistor cells, and wherein the plurality of transistor cells have one or more of a strip-shaped cell design, a square cell design or a polygonal cell design.

15. The vertical power semiconductor device of claim 14, wherein at least part of the gate trench structure extends along the second lateral direction, and wherein the body contact structure directly adjoins a part of the gate trench structure extending along the first lateral direction and a part of the gate trench structure extending along the second lateral direction.

16. The vertical power semiconductor device of claim 14, wherein the plurality of transistor cells are insulated gate bipolar transistor (IGBT) cells or reverse conducting insulated gate bipolar transistor (RC-IGBT) cells.

17. The vertical power semiconductor device of claim 1, wherein the source region directly adjoins the gate trench structure on one of opposite sidewalls.

18. The vertical power semiconductor device of claim 1, wherein the body contact region extends along the second lateral direction from a sidewall of the gate trench structure to a sidewall of a neighboring trench structure.

19. A method of manufacturing a vertical power semiconductor device, the method comprising:
providing a semiconductor body having a first main surface and a second main surface opposite to the first main surface along a vertical direction;
forming a gate trench structure at the first main surface, wherein at least part of the gate trench structure extends along a first lateral direction;
forming a body region of a first conductivity type directly adjoining the gate trench structure;
forming a source region of a second conductivity type directly adjoining the gate trench structure;
forming a drift region of the second conductivity type arranged between the body region and the second main surface; and
forming a body contact structure including a first body contact sub-region and a second body contact sub-region spaced at a first lateral distance along the first lateral direction,
wherein each of the first body contact sub-region and the second body contact sub-region directly adjoins the gate trench structure and has a larger doping concentration than the body region,
wherein in a channel region between the first body contact sub-region and the second body contact sub-region, the body contact structure has a second lateral distance to the gate trench structure along a second lateral direction perpendicular to the first lateral direction,
wherein the first lateral distance is equal to or less than twice the second lateral distance.

* * * * *